US009765433B2

(12) United States Patent
Huang

(10) Patent No.: US 9,765,433 B2
(45) Date of Patent: Sep. 19, 2017

(54) STRUCTURE OF SEXTANT ROTARY DISK

(71) Applicant: Yung-Chiu Huang, New Taipei (TW)

(72) Inventor: Yung-Chiu Huang, New Taipei (TW)

( * ) Notice: Subject to any disclaimer, the term of this patent is extended or adjusted under 35 U.S.C. 154(b) by 355 days.

(21) Appl. No.: 14/495,891

(22) Filed: Sep. 25, 2014

(65) Prior Publication Data
US 2016/0091014 A1 Mar. 31, 2016

(51) Int. Cl.
C23C 16/458 (2006.01)
H01L 21/687 (2006.01)
(Continued)

(52) U.S. Cl.
CPC ............ C23C 16/4584 (2013.01); B23Q 1/25 (2013.01); F16D 1/06 (2013.01); F16D 1/076 (2013.01);
(Continued)

(58) Field of Classification Search
CPC ..... B23Q 1/25; H01L 21/68; H01L 21/68785; H01L 21/68792; H01L 21/64; F16D 1/06; F16D 1/076; F16D 1/092; Y10T 403/34; Y10T 403/341; Y10T 403/366; Y10T 403/39; Y10T 403/3981; Y10T 403/40; Y10T 403/5741; Y10T 403/642;
(Continued)

(56) References Cited

U.S. PATENT DOCUMENTS 4,022,536 A * 5/1977 Piepho .................... E02F 9/006
403/154

4,152,086 A * 5/1979 Achenbach .............. B25G 3/28
403/297
(Continued)

FOREIGN PATENT DOCUMENTS

TW 296470 U * 8/2011 ............. H01L 21/64

OTHER PUBLICATIONS

"Sextant." Google.com. [online], [retrieved on Nov. 2, 2016]. Retrieved from the internet <URL:https://www.google.com/search?q=define%3A+sextant>.*

Primary Examiner — Josh Skroupa
Assistant Examiner — Cory B Siegert
(74) Attorney, Agent, or Firm — Leong C. Lei

(57) ABSTRACT

The fastening elements 71 are first set through the rotary disk 1 to be then fixed to the retention plates 2 so that the stretching force induced by the fixing operation is acting upon the retention plates 2. This helps prevent the rotary disk 1 from being affected by the stretching force and thus deformed. Further, the fastening holes 22 are located adjacent to the retention grooves 21 so that they can directly and effectively apply forces to the support members 3 and due to the torque (distance) thereof with respect to the support members 3 being reduced, it is possible to effectively reduce the occurrence of deformation of the retention plates 2. To summarize, since the stretching force induced by fixing is born by the retention plates 2, the rotary disk 1 may have a lifespan that is greater than that of the retention plates 2 and with the arrangement that releasable engagement is formed between the retention plates 2 and the rotary disk 1, it only needs to replace an individual one of the retention plates 2 that has been deformed in the maintenance thereof. Further, due to the size of the retention plates 2 being reduced, the cost of maintenance can be greatly lowered down.

5 Claims, 15 Drawing Sheets

(51) Int. Cl.
  *B23Q 1/25* (2006.01)
  *F16D 1/06* (2006.01)
  *F16D 1/076* (2006.01)
  *F16D 1/092* (2006.01)
  *H01L 21/68* (2006.01)

(52) U.S. Cl.
  CPC .............. *F16D 1/092* (2013.01); *H01L 21/68* (2013.01); *H01L 21/68771* (2013.01); *H01L 21/68785* (2013.01); *H01L 21/68792* (2013.01); *Y10T 403/34* (2015.01)

(58) Field of Classification Search
  CPC .............. Y10T 403/645; Y10T 403/142; Y10T 403/3986; Y10T 403/7056; Y10T 403/7067; Y10T 403/7026; Y10T 403/7035
  USPC ....... 403/169, 170, 183, 187, 199, 202, 306, 403/336, 337, 7, 200, 370, 374.3, 359.1, 403/359.6
  See application file for complete search history.

(56) References Cited

U.S. PATENT DOCUMENTS

| | | | | |
|---|---|---|---|---|
| 4,402,625 | A | * | 9/1983 | Rechkin .................. F16D 1/092 403/16 |
| 4,615,494 | A | * | 10/1986 | Focke .................... B65H 16/04 242/597.3 |
| 5,690,289 | A | * | 11/1997 | Takeuchi ............. A01K 89/006 242/282 |
| 2010/0129222 | A1 | * | 5/2010 | Hidding .................. F16D 1/033 416/170 R |
| 2011/0300297 | A1 | * | 12/2011 | Celaru ................ C23C 16/4584 427/255.5 |

\* cited by examiner

STRUCTURE OF SEXTANT ROTARY DISK

TECHNICAL FIELD OF THE INVENTION

The present invention generally relates to a rotary disk, and more particularly to a structure of a sextant rotary disk that allows for reduction of deformation for extension of lifespan, has a reduced maintenance cost, and is easy to disassemble after use.

DESCRIPTION OF THE PRIOR ART

Taiwan Utility Model M296470 discloses a support rotary disk module for wafers, which illustrates a conventional support rotary disk module as shown in FIG. 1, comprising a circular disk 91 having a surface in which at least two grooves 92 are formed, the grooves 92 being arranged to space from each other in a circumferential direction of the circular disk 91 with first fitting sections formed on opposite sides thereof; at least two insertion members, which each have an end comprising second fitting sections formed on opposite sides thereof and are respectively insertable into the grooves 92 with the first fitting sections respectively fit to the second fitting sections to securely hold one end of each of the insertion members with an opposite end extending beyond the circular disk 91 to support at least one wafer; at least one hold-down plate 93 that is positioned to press on the two grooves 92 of the surface of the circular disk 91, the hold-down plate 93 receiving a plurality of bolts extending through a middle portion thereof to screw to the circular disk 91 so that the hold-down plate 93 securely hold the ends of the two insertion members in the two grooves 92 of the circular disk 91 to be maintained in the same plane.

In use, since the circular disk 91 is recessed to form the grooves 92, an insufficient structural strength of the circular disk 91 may result. Also, since the bolts are screwed to the circular disk 91, a stretching force is induced, which leads to ready deformation and shortening of the lifespan of the circuit disk 91 during the operation thereof. Further, the circular disk 91 must be entirely replaced in repairing and maintenance and thus the maintenance cost is high.

Further, the circular disk 91 is provided with a rotary seat and rotary seat is coupled to a rotary bar in the form of a cylinder in order to make the circular disk 91 rotatable in unison with the rotary bar. However, it often occurs that the rotary seat and the rotary bar are stuck to during the use thereof, making disassembling very difficult and often resulting in damages of the rotary seat or even bending of the rotary bar.

SUMMARY OF THE INVENTION

An object of the present invention is to improve the problem of being ready to deform and thus shortening of the lifespan.

Another object of the present invention is to reduce the maintenance cost.

A further object of the present invention is to allow for easy separation of an insertion element and a rotary shaft after use.

To achieve the objects, the present invention comprises a rotary disk, which comprises a plurality of circumferentially distributed mounting slots formed therein. The mounting slots respectively receive retention plates therein. The retention plates each have sides in which retention grooves are formed. The rotary disk receives a plurality of fastening elements to extend therethrough to be respectively fixed to the retention plates. Arranged between the mounting slots and the retention grooves are support members that project outside the rotary disk. The fastening elements induce a stretching force that is applied to the retention plates so that the retention plates apply forces to the support members for fixing. The rotary disk is provided, at a center thereof, with a connection module. The connection module comprises an insertion element. The insertion element has an end in which a conic insertion hole in the form of a convergent configuration is formed. The conic insertion hole receives a rotary shaft to insert therein. An end of the rotary shaft that is inserted into the conic insertion hole comprises an insertion cone that has a convergent configuration corresponding to the conic insertion hole. Thus, with the arrangement of the mounting slots in the rotary disk, during the manufacturing, the bottom of the mounting slots can be thickened to increase the strength thereof. Further, the arrangement that the retention grooves are formed at the sides of the retention plates helps reduce the size of the retention plates. Further, with the stretching force induced by fixing being applied to the retention plates, the force applied to the rotary disk and thus the deformation thereof are reduced. Further, when the retention plates are deformed, it only needs to replace the deformed ones of the retention plates. Further, the engagement between the insertion cone and the conic insertion hole prevent invasion of plasma or corrosive gas in between the rotary shaft and the insertion element during the use thereof so as to facilitate dismounting thereafter. With the above-described solution, the problems that the conventional support rotary disk is easy to deform and has an insufficient lifespan, the maintenance cost is high, and components are stuck to each other after use and are thus difficult to dismount can be overcome so as to achieve reduction of deformation to extend the lifespan, lowering of the maintenance cost, and being easy to dismounted after use.

The foregoing objectives and summary provide only a brief introduction to the present invention. To fully appreciate these and other objects of the present invention as well as the invention itself, all of which will become apparent to those skilled in the art, the following detailed description of the invention and the claims should be read in conjunction with the accompanying drawings. Throughout the specification and drawings identical reference numerals refer to identical or similar parts.

Many other advantages and features of the present invention will become manifest to those versed in the art upon making reference to the detailed description and the accompanying sheets of drawings in which a preferred structural embodiment incorporating the principles of the present invention is shown by way of illustrative example.

DETAILED DESCRIPTION OF THE PREFERRED EMBODIMENTS

The following descriptions are exemplary embodiments only, and are not intended to limit the scope, applicability or configuration of the invention in any way. Rather, the following description provides a convenient illustration for implementing exemplary embodiments of the invention. Various changes to the described embodiments may be made in the function and arrangement of the elements described without departing from the scope of the invention as set forth in the appended claims.

Figure 1:
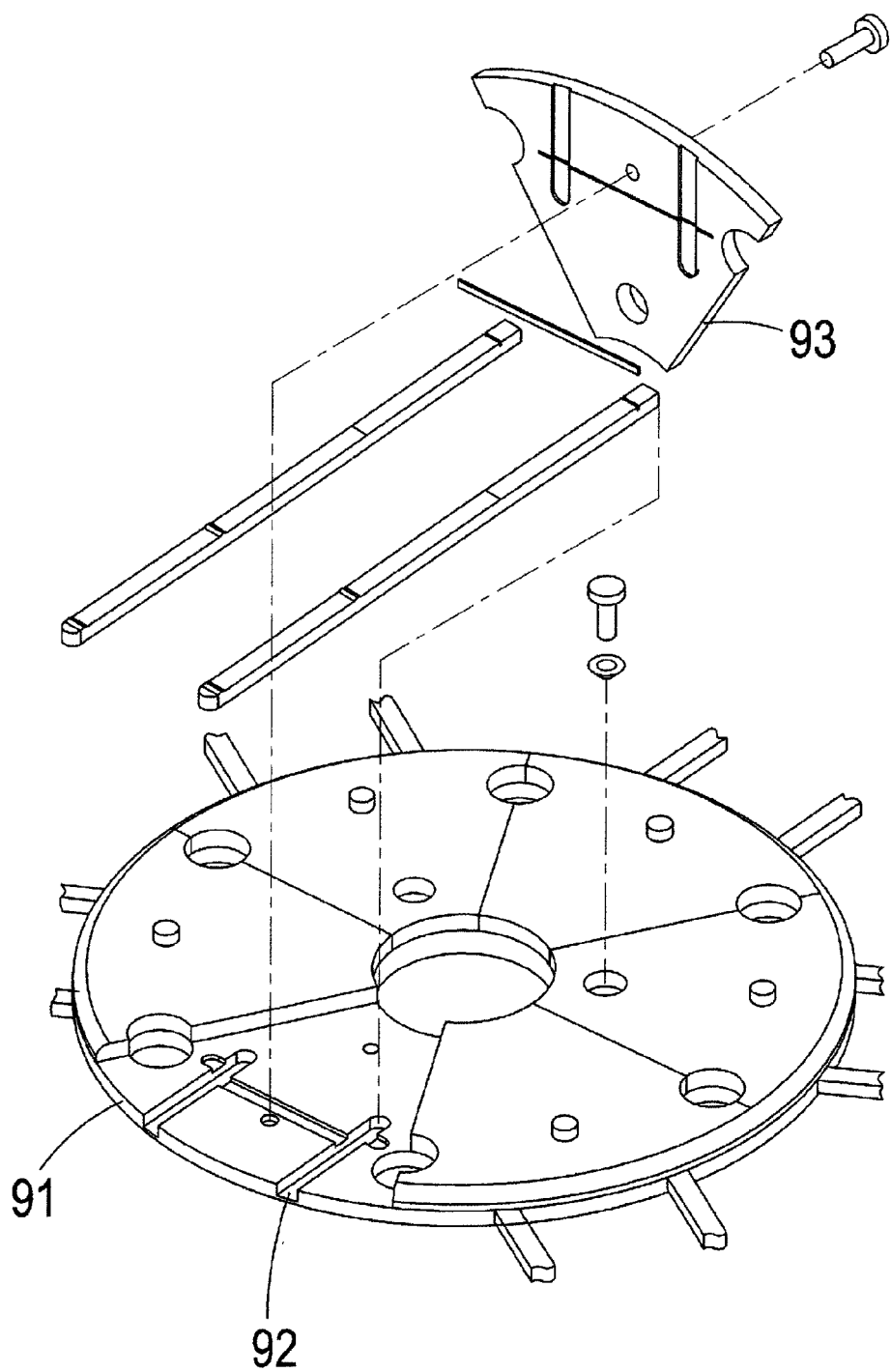
FIG. 1 is a schematic view showing a conventional support rotary disk module.
Figure 2:
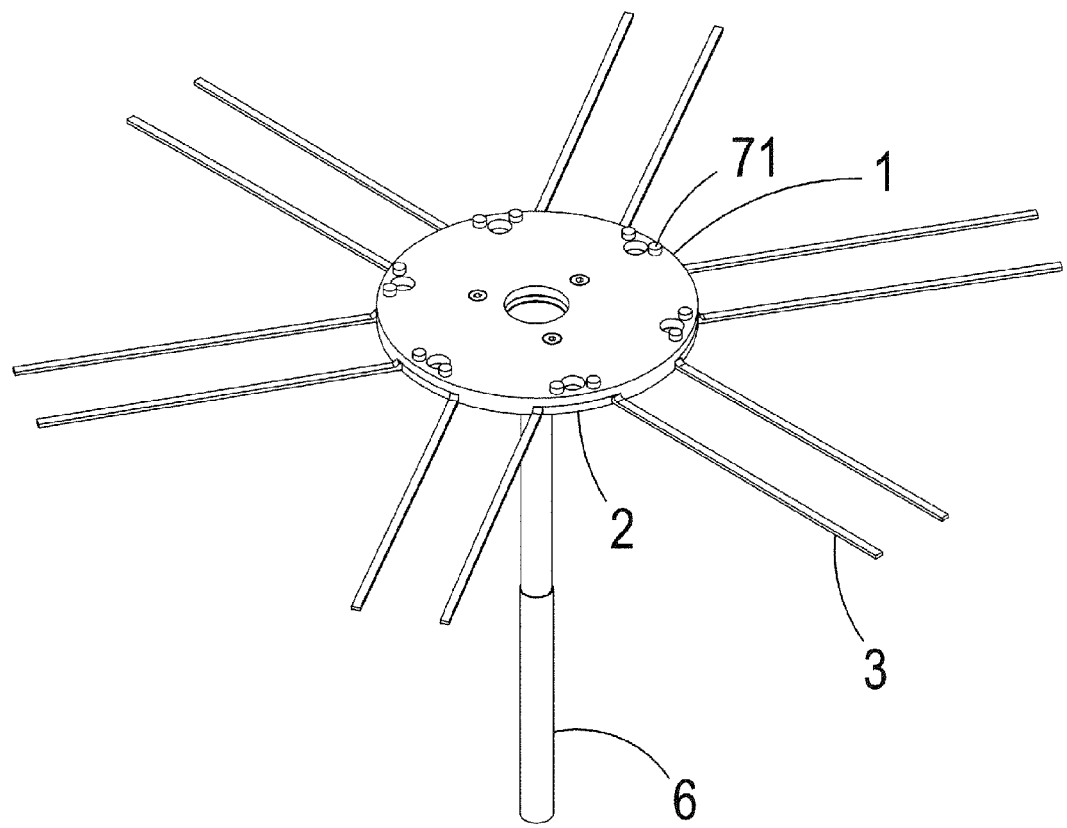
FIG. 2 is a schematic view showing an embodiment of the present invention.
Figure 3A:
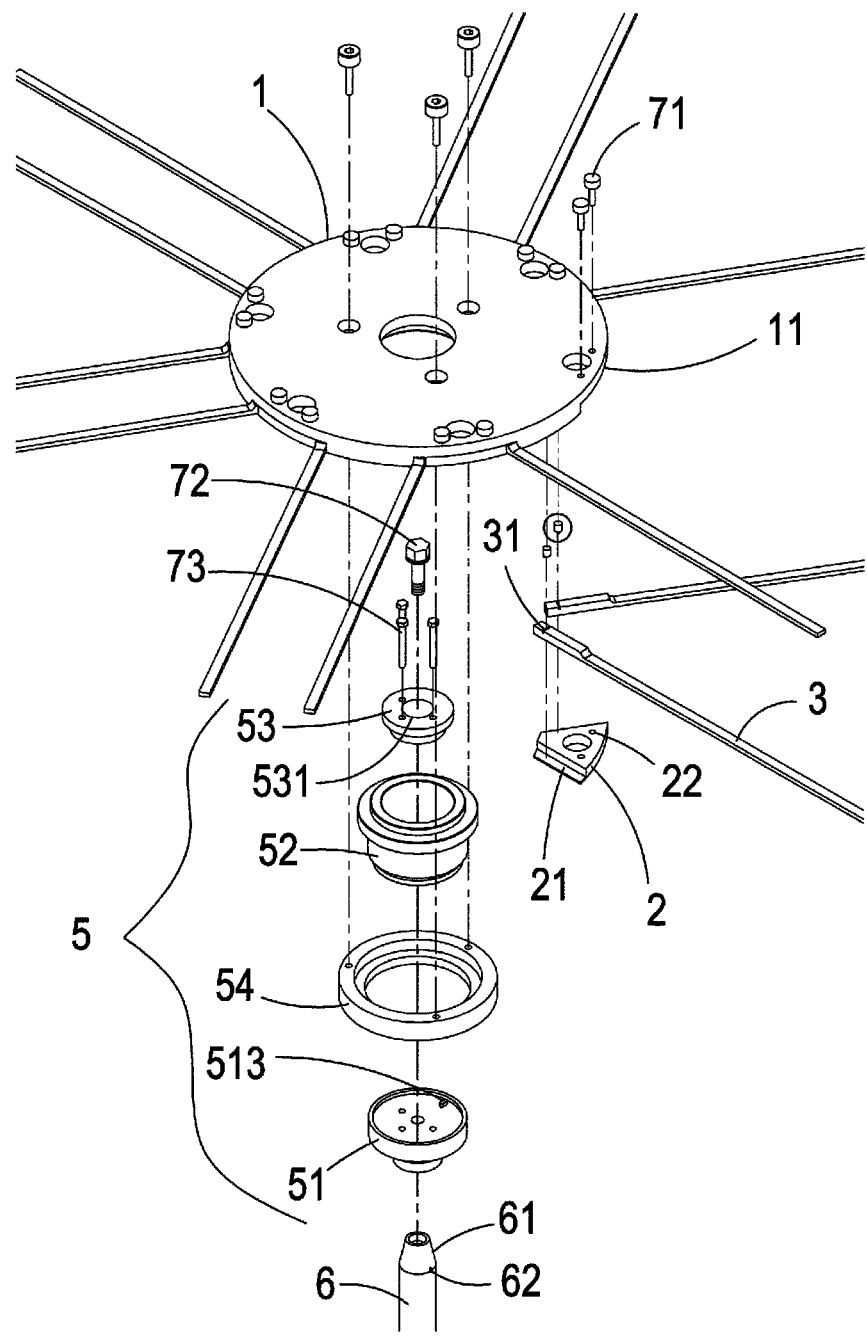
FIG. 3A is an exploded view of the present invention.
Figure 3B:
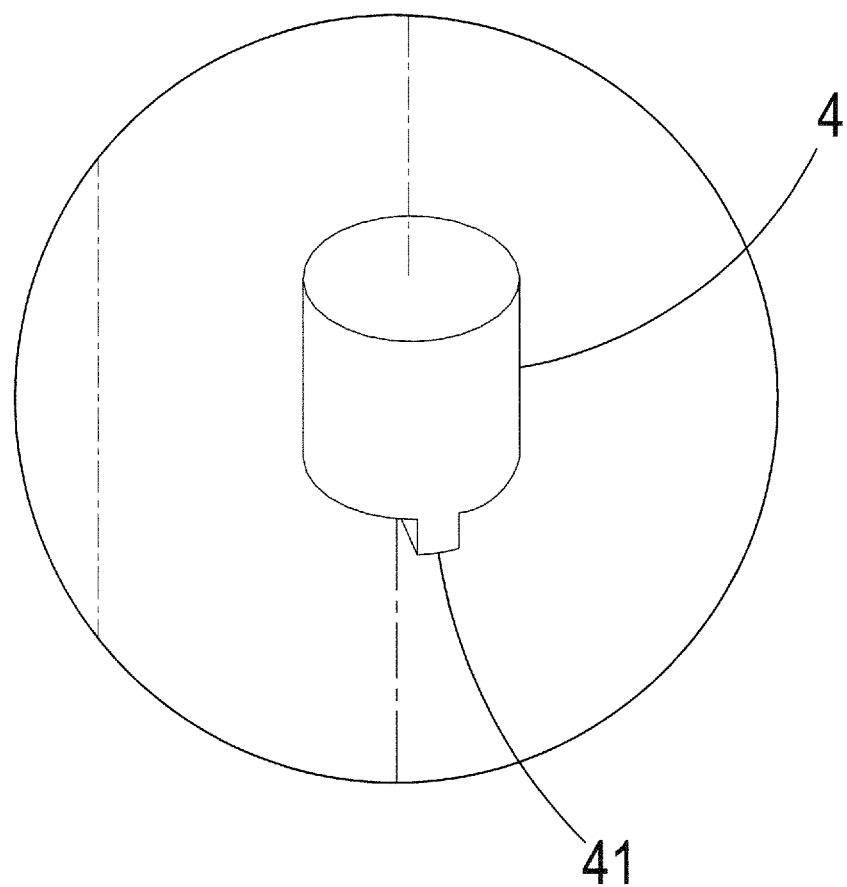
FIG. 3B is a perspective view showing a constraint section of the present invention.
Figure 3C:
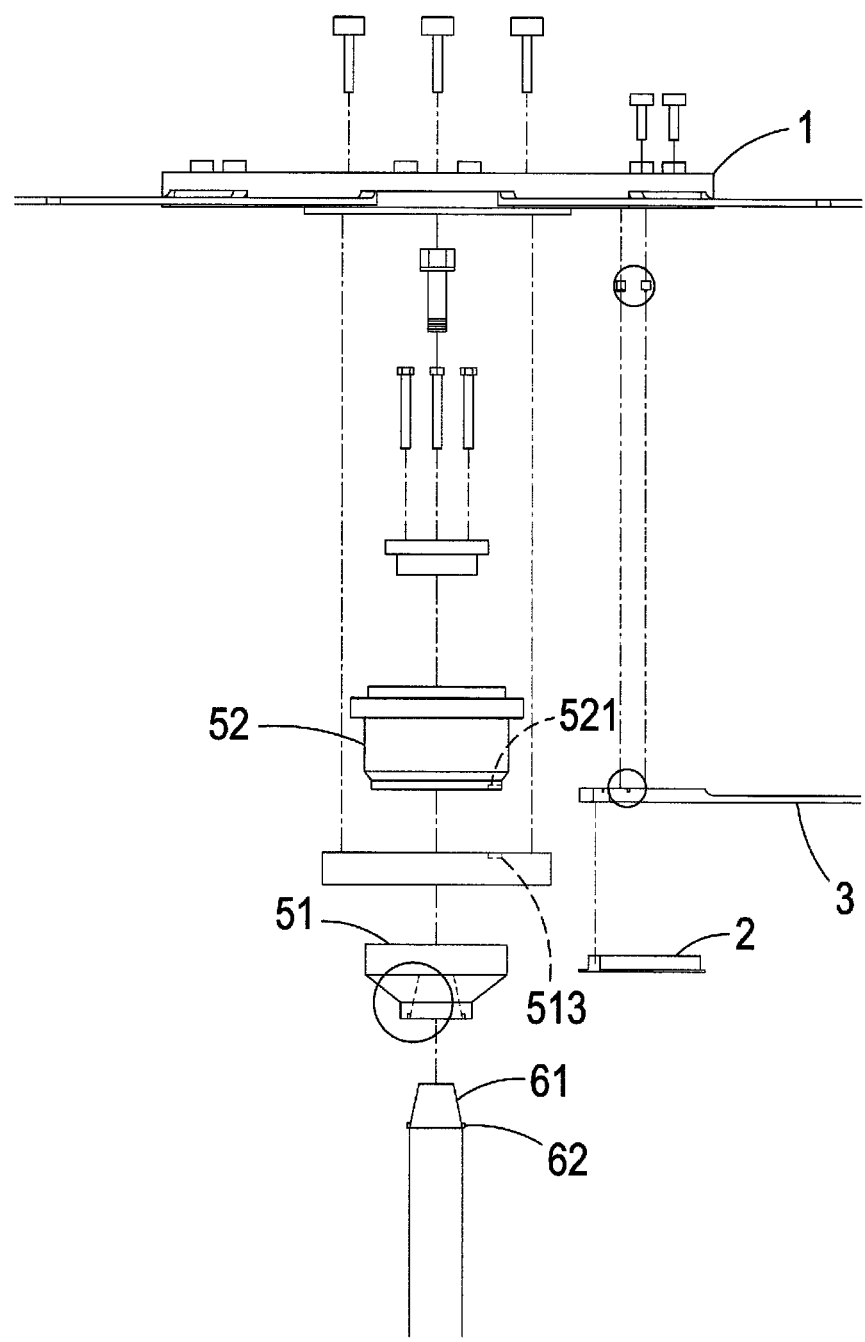
FIG. 3C is an exploded view of the present invention in a plan form.
Figure 3D:
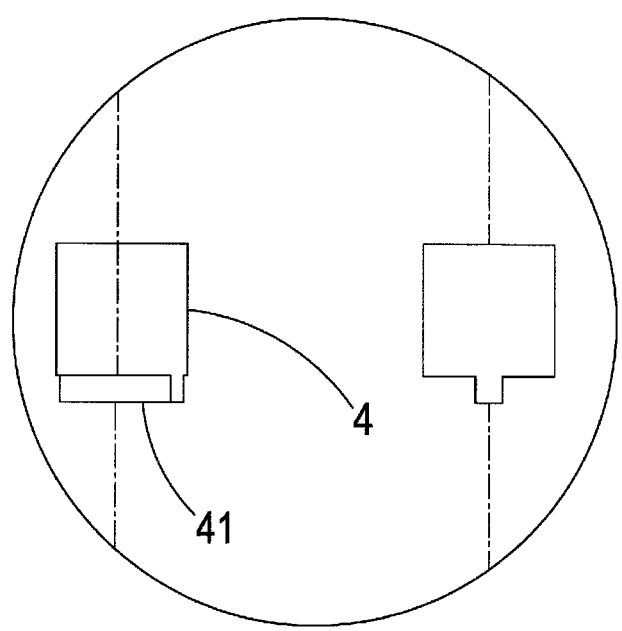
FIG. 3D is a schematic view showing the constraint section of the present invention in a plan form.
Figure 3E:
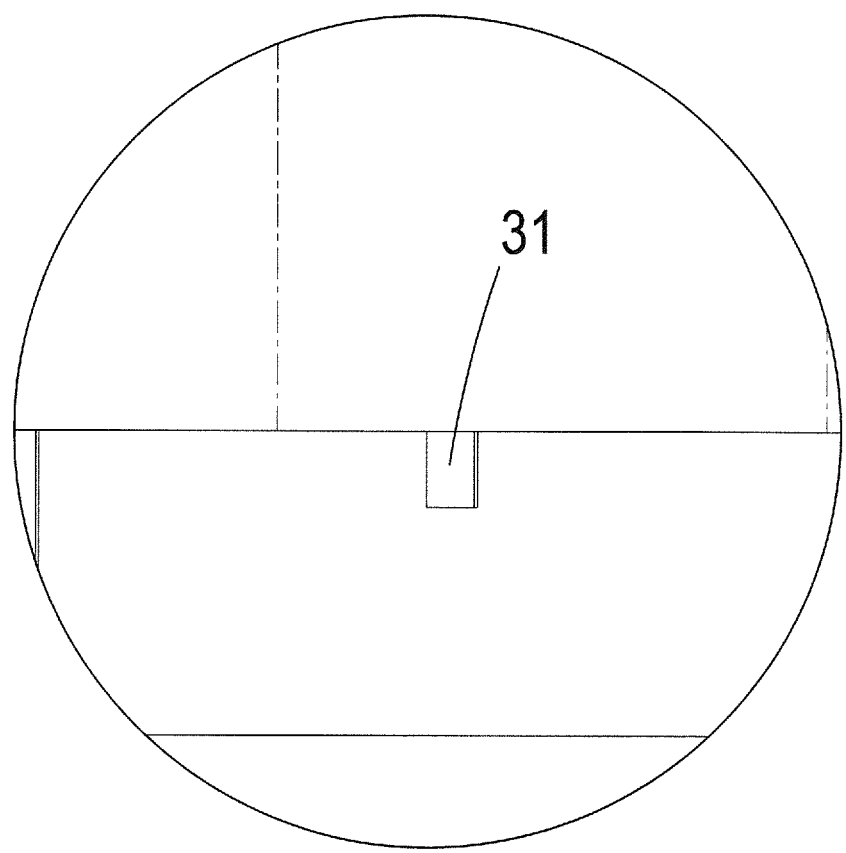
FIG. 3E is a schematic view showing a constraint groove of the present invention in a plan form.
Figure 3F:
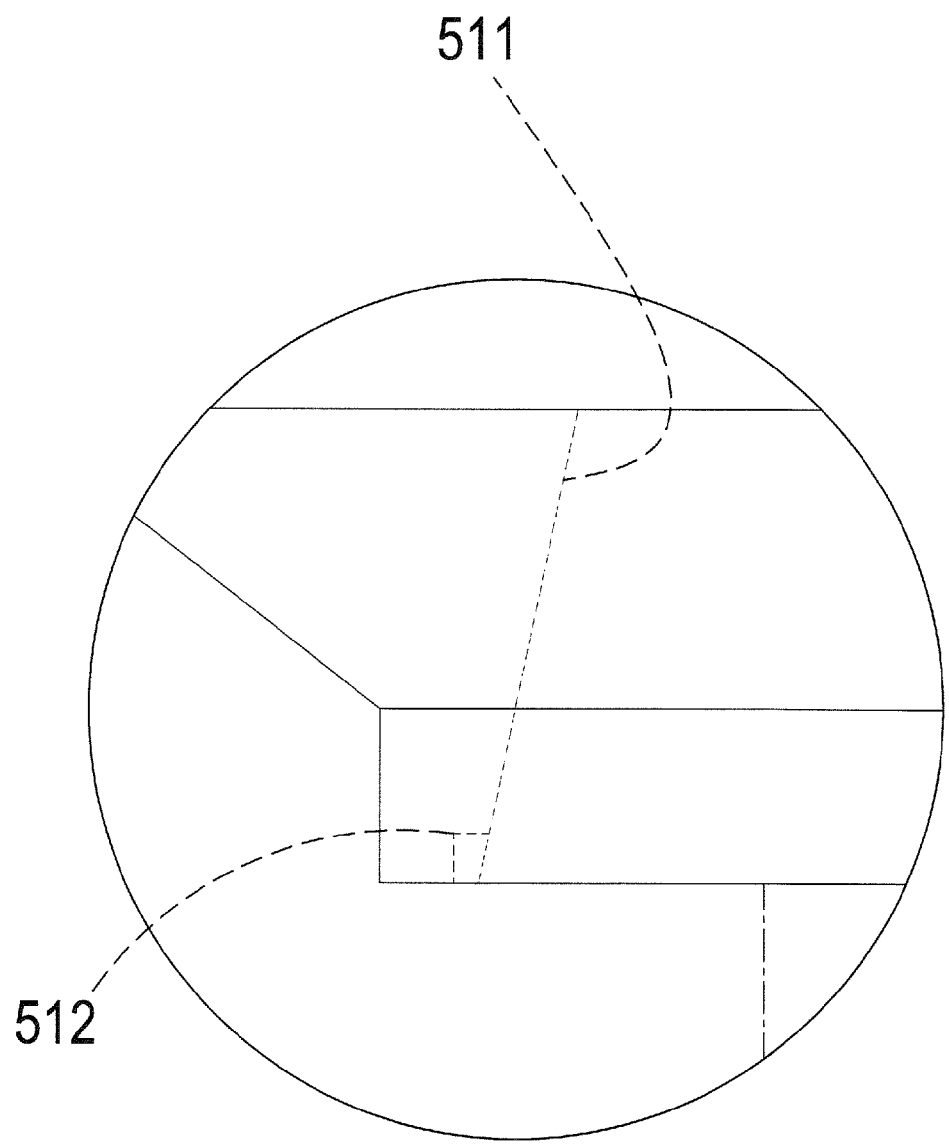
FIG. 3F is an enlarged view illustrating a convergent arrangement according to the present invention.
Figure 4:
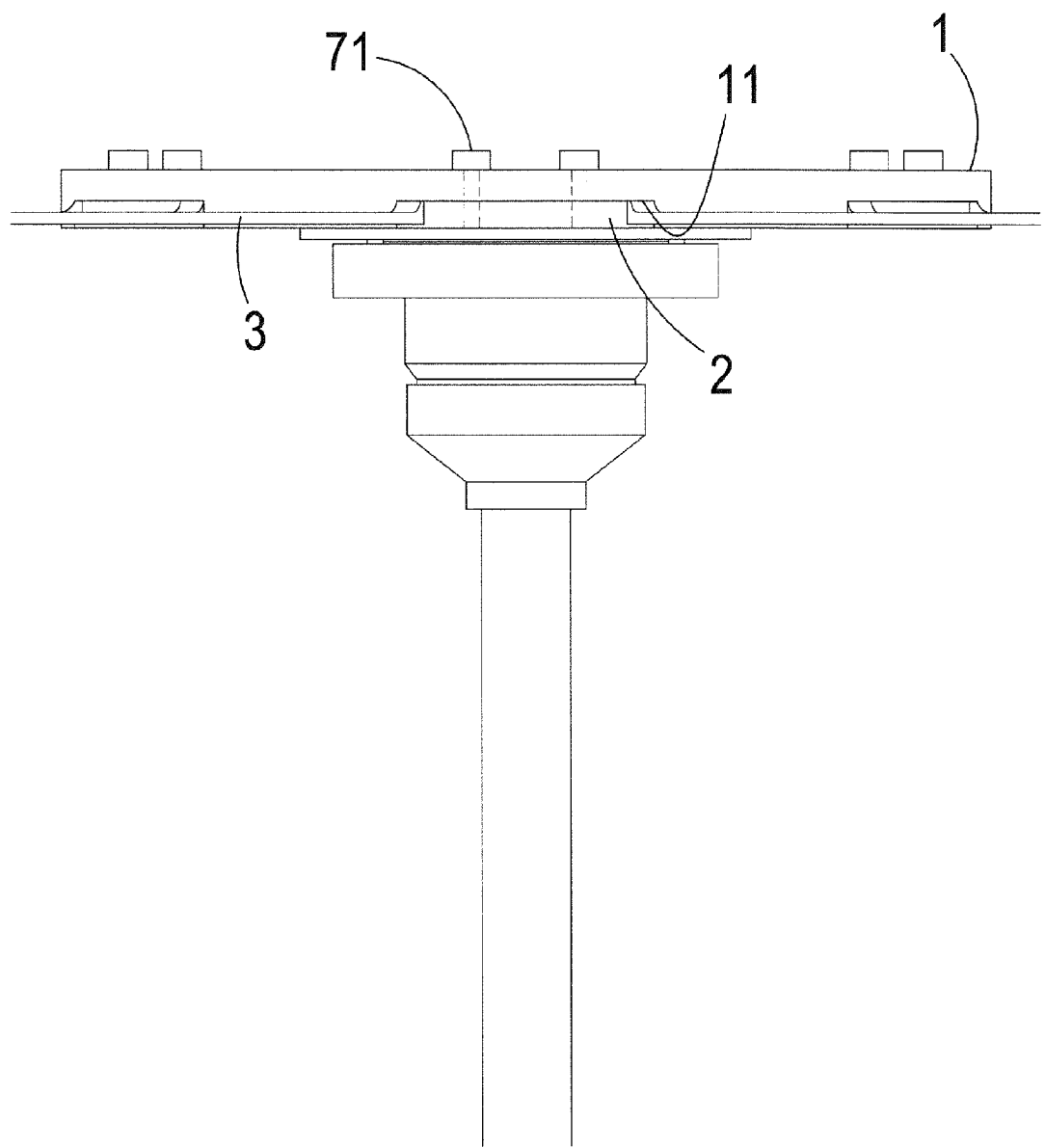
FIG. 4 is a schematic view illustrating a pressing arrangement according to the present invention.
Figure 5:
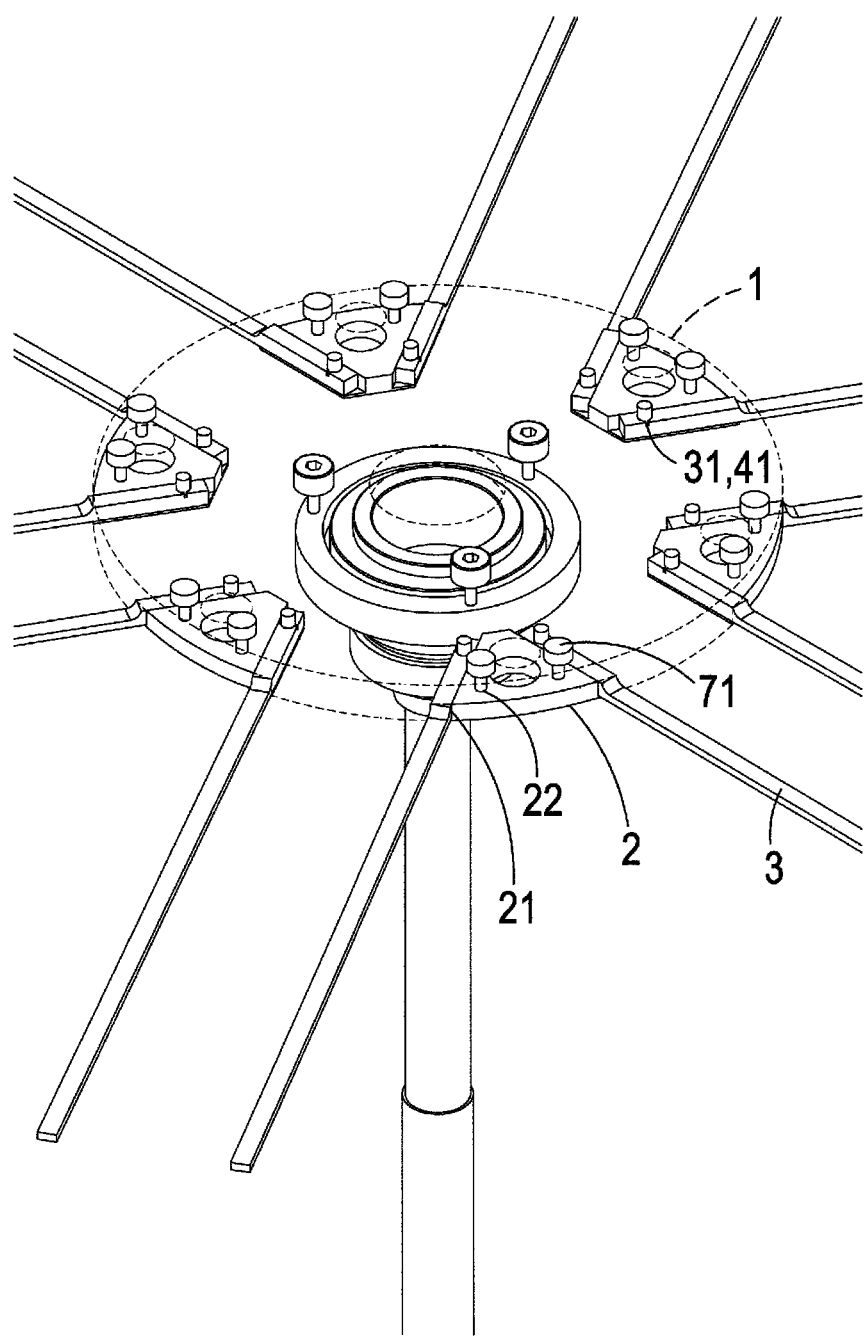
FIG. 5 is a schematic view illustrating a constraint arrangement according to the present invention.
Figure 6A:
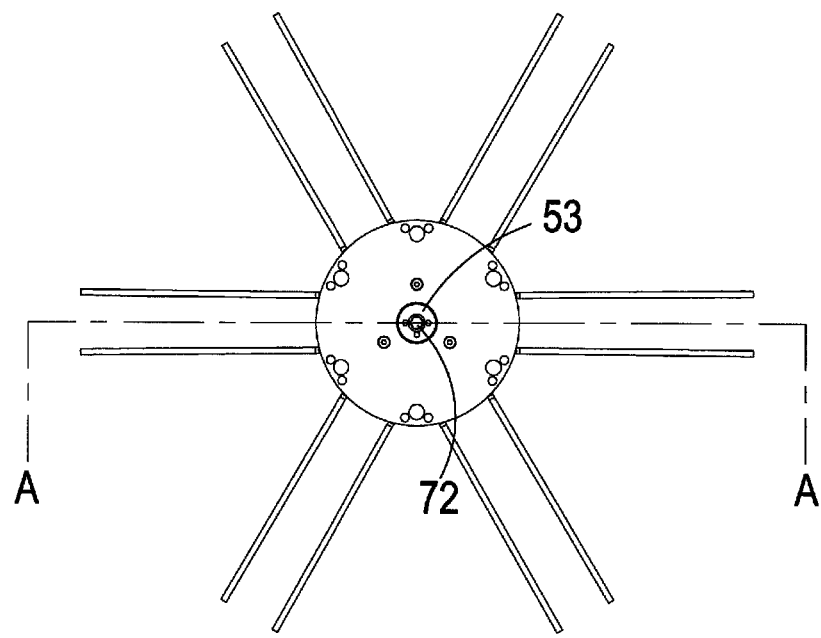
FIG. 6A is a schematic plan view showing a pressing element according to the present invention.
Figure 6B:
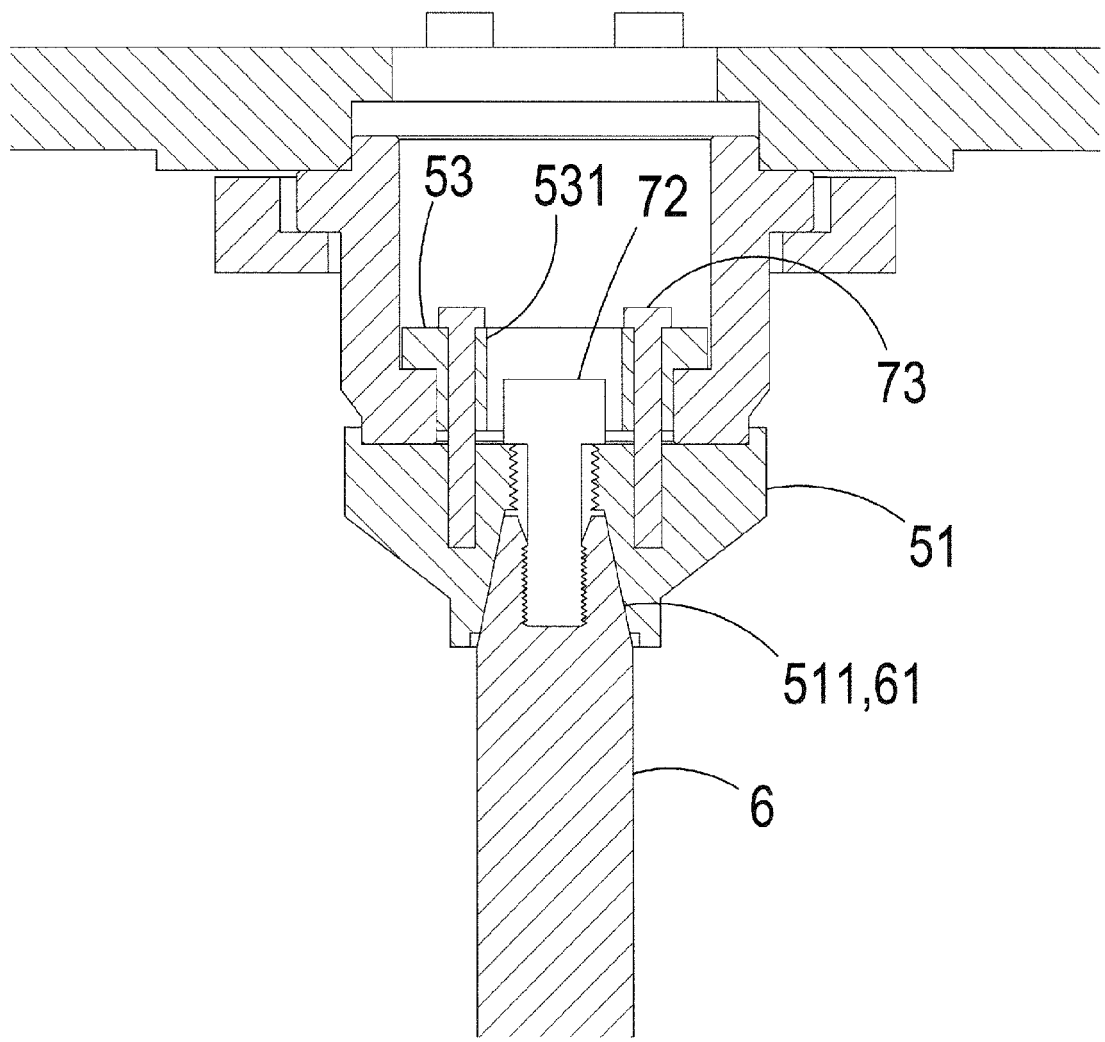
FIG. 6B is a cross-sectional view taken along line A-A of FIG. 6A.
Figure 7A:
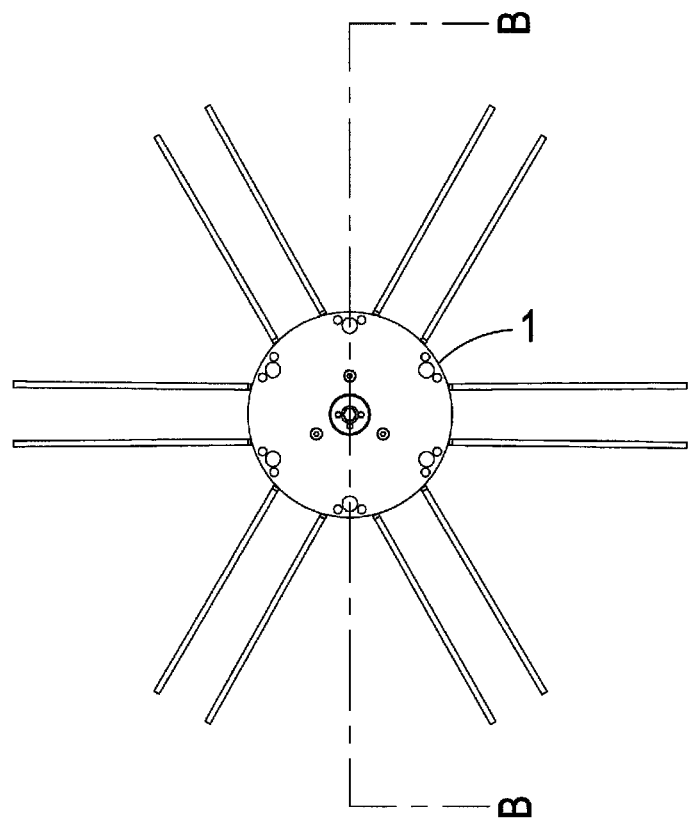
FIG. 7A is a schematic plan view showing a rotary disk according to the present invention.
Figure 7B:
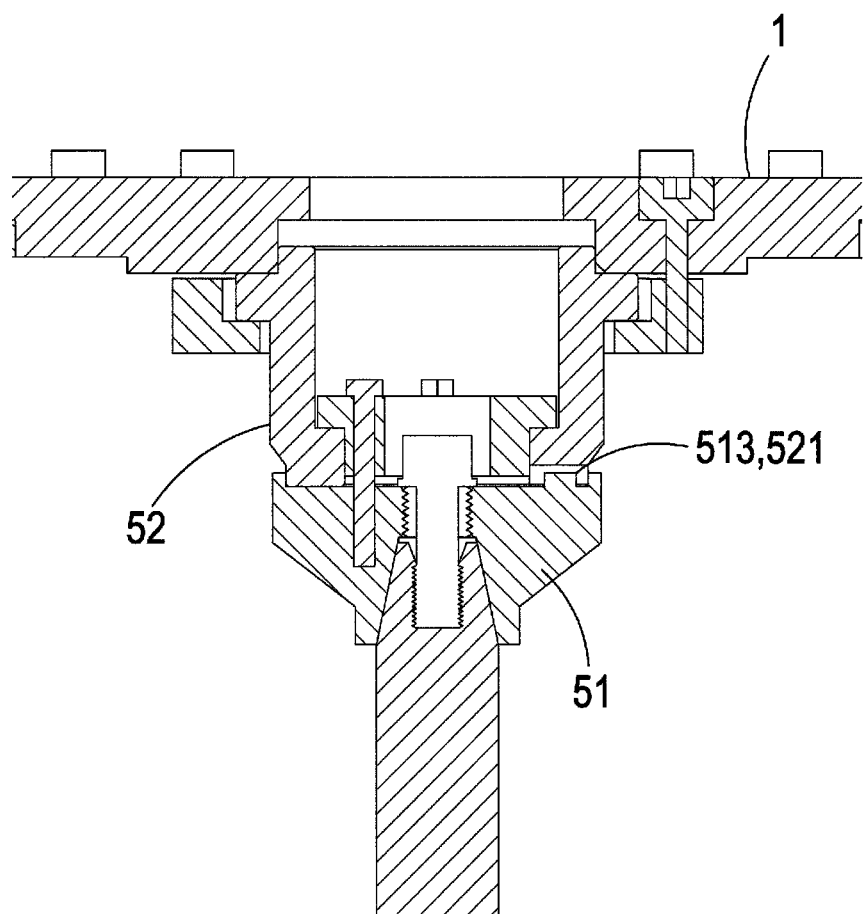
FIG. 7B is a cross-sectional view taken along line B-B of FIG. 7A.
Figure 8:
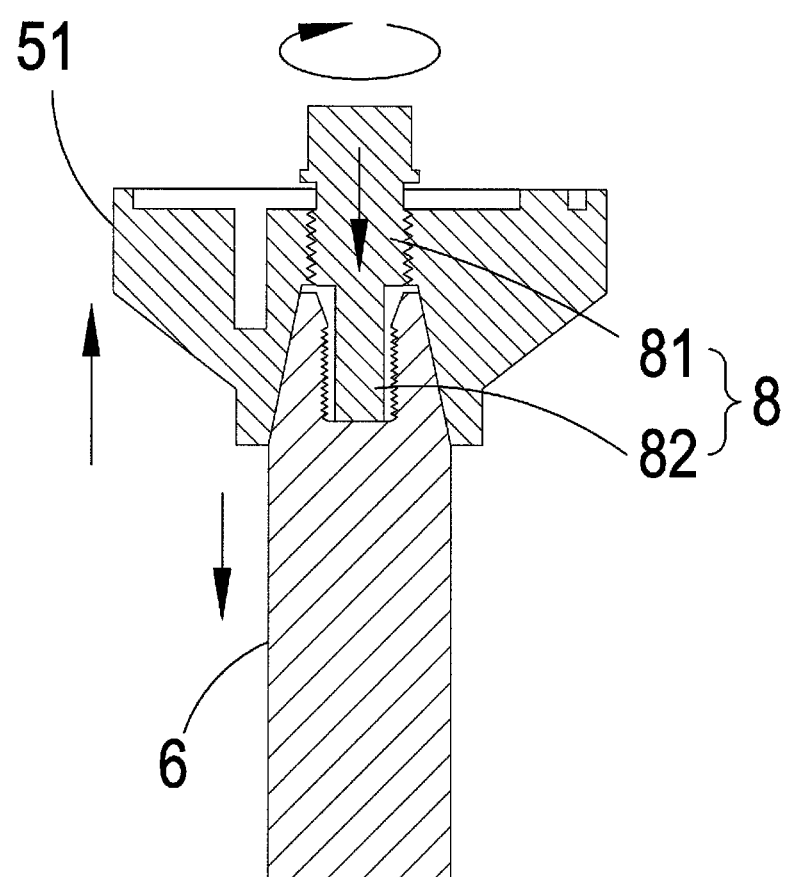
FIG. 8 is a schematic view illustrating an assisted dismounting operation according to the present invention.

Referring to FIGS. 2-8, the present invention comprises a rotary disk 1, a plurality of retention plates 2, a plurality of constraint elements 4, a plurality of support members 3, a plurality of fastening elements 71, a connection module 5, and a rotary shaft 6. The rotary disk 1 comprises a plurality of mounting slots 11 formed therein and distributed circumferentially. The retention plates 2 are respectively received in the mounting slots 11 and each has sides corresponding to side walls of the respective mounting slot 11 and forming at least one retention groove 21 and comprises at least one fastening hole 22 formed therein at a location adjacent to the retention groove 21. The support members 3 are respectively arranged between the mounting slots 11 and the retention grooves 21 in such a way as to project outside the rotary disk 1 and each has an end forming at least one constraint groove 31. The mounting slots 11 are each provided with at least one constraint element 4 at a location where the support member 3 is arranged. The constraint element 4 comprises a constraint section 41 projecting beyond a bottom of the mounting slot 11 so that engagement is made between the constraint section 41 and the constraint groove 31 to prevent the support members 3 from getting out of the retention groove 21. The fastening elements 71 extend through the rotary disk 1 and the fastening holes 22 of the retention plates 2 for fastening so that the retention plates 2 press against and thus fix the support members 3 in position.

The connection module 5 is set at a center of the rotary disk 1. The connection module 5 comprises an insertion element 51, an insulation element 52 arranged between the insertion element 51 and the rotary disk 1, a pressing element 53 arranged in the insulation element 52, and a ring element 54 fit over the insulation element 52 and mounted to the rotary disk 1. The insertion element 51 has an end on which a positioning rib 513 is formed and an opposite end forming a conic insertion hole 511 in a tapering configuration. The conic insertion hole 511 comprises a guide slot 512 formed therein. The rotary shaft 6 has an end inserted into the conic insertion hole 511 and the end forms an insertion cone 61 that is in a tapering configuration corresponding to the conic insertion hole 511. The insertion cone 61 is provided with a guide rib 62 corresponding to the guide slot 512. The insulation element 52 has an end on which at least positioning groove 521 is formed to correspond to the positioning rib 513. The insulation element 52 and the insertion element 51 collectively receive a securing element 72 extending through centers thereof and the securing element 72 is secured to a center of the insertion cone 61. The arrangement of the single securing element 72 allows the size thereof to be increased and thickened to improve the structural strength thereof. The pressing element 53 has an end inserted into the insulation element 52 so as to increase the thickness and improve structural strength thereof and comprises a working hole 531 formed in a center thereof to receive extension of the securing element 72 therethrough. The pressing element 53 also comprises a plurality of connection elements 73 that extend through the insulation element 52 to extend therethrough so that the connection elements 73 are fixable to the insertion element 51 to secure the insulation element 52 in position. The ring element 54 has an end that is extended to partly cover the insulation element 52 so as to increase the thickness and improve structural strength thereof. Further, since the ring element 54 is mounted to the rotary disk 1, it is possible to use the rotary shaft 6 to drive the rotary disk 1 to rotate.

Thus, in manufacturing the rotary disk 1, with the arrangement that mating engagement between the mounting slots 11 and the retention plates 2 allows the bottom of the mounting slots 11 to be increased in respect of the thickness thereof in order to enhance the structural strength of the rotary disk 1 and reduce the potential risk of deformation. Further, the combination of the retention plates 2, the mounting slots 11, and the fastening elements 71 allows for mounting of the retention plates 2 in the mounting slots 11 to be achieved by aligning the constraint grooves 31 with the constraint sections 41 and positioning the support members 3 against side walls of the mounting slots 11 so that the retention grooves 21 can automatically mate the support members 3 for subsequent fastening the retention plates 2 with the fastening elements 71 so that the installation of the present invention is easy and simple. Further, the arrangement that the retention grooves 21 are formed at the sides of the retention plates 2 helps reduce the size of the retention plates 2.

The fastening elements 71 are first set through the rotary disk 1 to be then fixed to the retention plates 2 so that the stretching force induced by the fixing operation is acting upon the retention plates 2. This helps prevent the rotary disk 1 from being affected by the stretching force and thus deformed. Further, the fastening holes 22 are located adjacent to the retention grooves 21 so that they can directly and effectively apply forces to the support members 3 and due to the torque (distance) thereof with respect to the support members 3 being reduced, it is possible to effectively reduce the occurrence of deformation of the retention plates 2. To summarize, since the stretching force induced by fixing is born by the retention plates 2, the rotary disk 1 may has a lifespan that is greater than that of the retention plates 2 and with the arrangement that releasable engagement is formed between the retention plates 2 and the rotary disk 1, it only needs to replace an individual one of the retention plates 2 that has been deformed in the maintenance thereof. Further, due to the size of the retention plates 2 being reduced, the cost of maintenance can be greatly lowered down.

During a use, the insertion element 51 and the rotary shaft 6 can effectively prevent invasion of plasma or corrosive gas by means of the tight engagement between the conic insertion hole 511 and the insertion cone 61. Further, due to the convergent configurations, separation of the rotary shaft 6 and the connection module 5 from each other is made easy thereby effectively reducing the occurrence of the connection module 5 and the rotary shaft 6 being stuck to each other.

Further, a dismounting element 8 is additionally provided to assist separating the insertion element 51 and the rotary shaft 6 from each other. The dismounting element 8 comprises a threaded section 81 and an idle section 82 extending from the threaded section 81. To dismount, the dismounting element 8 is inserted into the insertion element 51 and is rotated to have the threaded section 81 engaging the insertion element 51, while the idle section 82 is moved forward with the rotation to get into and abut the rotary shaft 6. When the idle section 82 abuts the rotary shaft 6 and makes idle rotation with the subsequent rotation of the dismounting element 8, the threaded section 81, due to the rotation, applies a pulling force on the insertion element 51 that makes the insertion element 51 easily separate from the rotary shaft 6.

Thus, the key factors that the structure of the present invention improves the drawbacks of the prior art are as follows:

(1) The combination of the rotary disk 1, the retention plates 2, and the fastening elements 71 allows the present invention to reduce deformation and extend the service life thereof and also lower down the maintenance cost.

(2) The combination of the insertion element 51 and the rotary shaft 6 allows the present invention to be easily dismounted after use.

It will be understood that each of the elements described above, or two or more together may also find a useful application in other types of methods differing from the type described above.

While certain novel features of this invention have been shown and described and are pointed out in the annexed claim, it is not intended to be limited to the details above, since it will be understood that various omissions, modifications, substitutions and changes in the forms and details of the device illustrated and in its operation can be made by those skilled in the art without departing in any way from the spirit of the present invention.

I claim:

1. A sextant rotary disk structure, comprising:
a rotary disk (1);
a connection module (51, 52, 53, 54), wherein the connection module (51, 52, 53, 54) is set at a center of the rotary disk (1) and the connection module (51, 52, 53, 54) comprises an insertion element (51), the insertion element (51) having an end in which a conic insertion hole in a convergent configuration is formed; and
a rotary shaft (6), wherein the rotary shaft (6) has an end insertable into the conic insertion hole to drive the rotary disk (1) to rotate, the end of the rotary shaft (6) comprising an insertion cone formed in a convergent configuration to correspond to the conic insertion hole so that the rotary shaft (6) and the connection module (51, 52, 53, 54) are allowed to separate from each other;
wherein the connection module comprises an insulation element (51) arranged between the insertion element (51) and the rotary disk, a pressing element (53) arranged inside the insulation element (52), and a ring element (54) fit over the insulation element (52), the pressing element (53) having an end extending into the insulation element (52) to increase thickness and improve structural strength, the pressing element (53) comprising a working hole formed in a center thereof to receive extension of the securing element, the pressing element (53) receiving a plurality of the connection elements (13) that extend through the insulation element (52) to extend therethrough so that the connection elements (13) are fixable to the insertion element to secure the insulation element (52) in position, the ring element (54) having an end extended to partly cover the insulation element (52) to increase thickness and improve structural strength, the ring element (54) being mounted to the rotary disk (1) to allow the rotary shaft (6) to drive the rotary disk (1) to rotate.

2. The sextant rotary disk structure according to claim 1, wherein the conic insertion hole (511) comprises a guide slot (512) formed therein and the insertion cone comprises at least one guide rib (62) corresponding to the guide slot (512).

3. The sextant rotary disk structure according to claim 1, wherein the insertion element (51) receives a securing element (72) to extend through a center thereof, the securing element (72) being fixed to a center of the insertion cone (6).

4. The sextant rotary disk structure according to claim 1, wherein the insulation element (52) has an end in which at least one positioning groove is formed and the insertion element (51) has an end on which a positioning rib (513) that corresponds to the positioning groove (521) is formed.

5. The sextant rotary disk structure according to claim 1, wherein the insertion element (51) and the rotary shaft (6) are separable from each other by a dismounting element (8), the dismounting element (8) comprising a threaded section (81) and an idle section (82) extending from the threaded section (81), the idle section (82) extending through the insertion element (51) to be insertable into the rotary shaft (6) with the threaded section (81) threadingly mating the insertion element (51) for operation.

* * * * *